United States Patent [19]

MacGugan

[11] Patent Number: 4,825,166

[45] Date of Patent: Apr. 25, 1989

[54] BOBBIN FOR A MAGNETIC SENSOR

[75] Inventor: Douglas C. MacGugan, Issaquah, Wash.

[73] Assignee: Sundstrand Data Control, Inc., Redmond, Wash.

[21] Appl. No.: 7,314

[22] Filed: Jan. 27, 1987

[51] Int. Cl.[4] .................... G01V 3/26; G01R 33/04; H01F 3/04; H01F 17/06

[52] U.S. Cl. ........................... 324/346; 29/606; 324/253; 336/213; 336/221

[58] Field of Search ........ 324/244, 247, 249, 252–255, 324/346; 29/605, 606; 33/361, 363 R; 336/199, 208, 229, 233, 213, 221; 148/435; 420/487

[56] References Cited

U.S. PATENT DOCUMENTS

| 2,963,670 | 12/1960 | Spencer et al. | 336/229 X |
|---|---|---|---|
| 3,018,455 | 1/1962 | Brandon, Jr. et al. | |
| 3,148,346 | 9/1964 | Goethe et al. | |
| 3,253,911 | 5/1966 | Cairns | 420/487 |
| 3,403,329 | 9/1968 | Geyger | 324/254 |
| 3,434,047 | 3/1969 | Brickner | 324/253 |
| 3,453,531 | 7/1969 | Warren | 324/346 |
| 3,721,400 | 3/1973 | Weissman | |
| 3,728,106 | 4/1973 | Badia et al. | 420/487 X |
| 3,873,913 | 3/1975 | Obenschain | 324/262 |
| 3,982,431 | 9/1976 | Grosso et al. | 73/151 |
| 4,013,945 | 3/1977 | Grosso | 324/208 |
| 4,068,164 | 1/1978 | Schwartz et al. | 324/253 X |
| 4,110,689 | 8/1978 | Schonstedt | 324/254 |
| 4,181,014 | 1/1980 | Zuvela et al. | 73/151 |
| 4,323,848 | 4/1982 | Kuckes | 324/247 X |
| 4,447,776 | 5/1984 | Brown | 324/253 |
| 4,536,710 | 8/1985 | Dunham | 324/253 X |
| 4,612,167 | 9/1986 | Watanabe et al. | 420/487 X |
| 4,616,424 | 10/1986 | Arakawa et al. | 33/361 |
| 4,633,248 | 12/1986 | Small | 367/25 X |
| 4,636,763 | 1/1987 | Nabstedt et al. | 336/192 |
| 4,677,381 | 6/1987 | Geerlings | 324/253 |

FOREIGN PATENT DOCUMENTS

| 831637 | 1/1970 | Canada | 33/361 |
|---|---|---|---|
| 1039664 | 9/1958 | Fed. Rep. of Germany | |
| 771580 | 10/1980 | U.S.S.R. | 324/254 |

Primary Examiner—Gerard R. Strecker
Attorney, Agent, or Firm—Michael Yatsko; Trevor Joike; James Wanner

[57] ABSTRACT

A magnetometer sensor is described for a borehole survey. The magnetometer features a bobbin made from a metal alloy such as copper-nickel, which has a very low magnetic permeability, on the order of 1.0001, which can be joined to a magnetic metal alloy, such as Permalloy, by welding, which can be treated by annealing at a temperature of 1500 degrees Fahrenheit and which has a thermal coefficient of expansion generally on the order of the magnetic alloy. In one particular embodiment, the magnetometer sensor comprises a strip of magnetic metal alloy wrapped around the aforesaid bobbin to define a magnetic core, one excitation winding wrapped around the core, a plastic frame for carrying the magnetic core and excitation winding and at least one sense winding wrapped around the frame, the core and the excitation winding.

19 Claims, 4 Drawing Sheets

BOBBIN FOR A MAGNETIC SENSOR

TECHNICAL FIELD

This invention is generally related to the subject of magnetometers or flux-gates and, in particular, to the magnetic sensor portion of a magnetometer as used in borehole survey instruments.

BACKGROUND OF THE INVENTION

Flux-gate magnetometers have been used for some time to measure the earth's magnetic field. They have been very instrumental in high accuracy surveying of oil wells or boreholes. A flux-gate consists of a core of highly magnetically permeable material, such as Permalloy-80. Such material saturates at low field strengths and has a magnetic characteristic curve (i.e., BHH curve or hysteresis curve) exhibiting a high degree of "squareness". (See U.S. Pat. No. 4,447,776.) The core is wrapped by an electrical winding through which an alternating current is passed, so as to create an oscillating, saturating field. One or more sensing coils are wrapped around the core to measure and balance the saturating field. This Lechnology is well know and has been used with some success for many years. Some representative U.S. Pat. Nos. are: 3,403,329; 3,982,431; 4,013,945; and 4,181,014.

The core material is highly sensitive to stress and strain. Therefore, any useful flux-gate magnetometer, especially a flux-gate sensor used in an oil drilling environment, has to have its core mounted to withstand the stress caused by shock, vibration, pressure and temperature. To this end, the core material is conventionally wrapped around a bobbin or spool to stabilize the material and form a base or frame around which the coils may be wrapped.

In some products, the bobbin form is made from a ceramic substrate. (See U.S. Pat. No. 3,873,913) A ceramic has several advantages: it is non-magnetic to a high degree, it is stable over annealing temperatures of 1500 degrees F. and, it is capable of performing in a rugged environment. However, there are some disadvantages: the thermal coefficient of expansion is significantly different from that of the core material, often resulting in a loose fit of the core at high temperatures; stress induced property changes are possible, it is difficult to epoxy bond to the core material wound around it; and it is relatively large in size.

Some bobbins are made of stainless steel. See U.S. Pat. Nos. 4,068,164 and 4,447,776). A stainless steel bobbin overcomes some of the drawbacks of a ceramic bobbin. In particular, stainless steel has a temperature coefficient relatively close to that of the core material. Moreover, one and of the core material can be welded to the bobbin for a good start in winding the core material (usually a thin, foil-like tape) about the bobbin. Moreover; it has a relatively small size, and stainless steel can withstand the high temperatures of annealing and the extreme temperature environment of a borehole application.

Heretofore, it was thought that by proper selection and handling, ordinary austenitic stainless steel is sufficiently non-magnetic so as not to affect the performance of a flux-gate. As a result of testing and calibration of high sensitivity flux-gates, I determined that ordinary austenitic stainless steels do affect the performance of a flux-gate. In particular, I have found that the residual permeability of a stainless steel bobbin causes a bias shift, dependent on the strength of the external field and the amount of permeability.

My invention offers a solution to these problems without introducing any of the drawbacks of a ceramic bobbin. Specifically, I propose a bobbin construction which has ultra-low permeability, is weldable through normal methods, withstands the temperature of annealing, is rugged to shock and vibration, is relatively small in size, approaching that of stainless steel, and has a temperature coefficient comparable to the core material.

SUMMARY OF THE INVENTION

In accordance with my invention, I disclose a bobbin which has ultra-low permeability, is weldable under normal methods, withstands high anneal temperatures, is rugged, and has a temperature coefficient comparable to Permalloy. In particular, I have found that a bobbin made of a copper-nickel alloy, especially one containing greater than 60 percent copper, is very useful for the short-comings in the art just described.

Specifically, I claim a magnetometer sensor for use in the borehole survey tool of the type comprising a spool-shaped bobbin made of a non-magnetic copper alloy; a strip of a magnetic metal alloy wrapped around the bobbin to define a magnetic core; an excitation winding wrapped around the magnetic core; and at least one sense winding wrapped around the core and the excitation winding.

In one embodiment, the bobbin is made from a copper-nickel alloy. In that specific embodiment, the magnetometer sensor fits within a housing made from a non-electrically conductive, high temperature thermal plastic, such as Poly-ether-ether-ketone (or PEEK). Other desirable bobbin materials are those copper-nickel alloys containing greater than 60 weight percent copper, such as 70/30, 80/20, 90/10 as well as copper and nickel alloyed with manganese, as in 60/20/20.

In particular, I have found that such a bobbin has ultra-low permeability, is weldable to Permalloy using ordinary methods, withstands an anneal temperature of 1500 degrees F. in a hydrogen atmosphere, is rugged to shock and vibration, has a thermal coefficient of expansion comparable to the Permalloy, and is just as small as a stainless steel bobbin.

Numerous advantages and features of the present invention will become readily apparent from the following detailed description of the invention, the embodiments described therein, and from the claims which follows.

DETAILED DESCRIPTION

Figure 1:
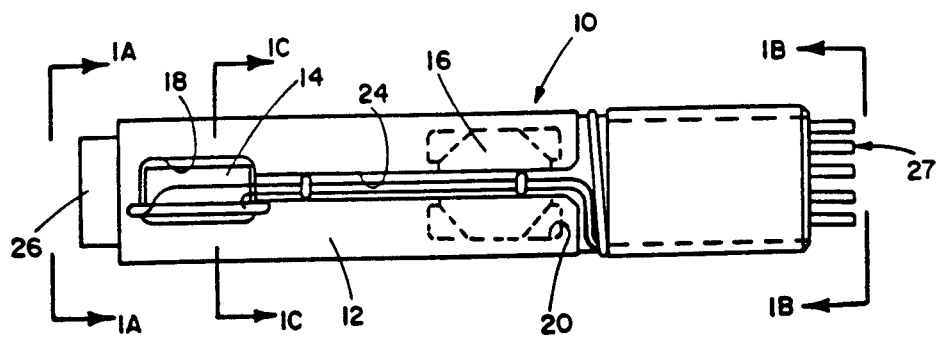
FIG. 1 is a side elevational view of a magnetometer ring core assembly having therein the sensor bobbin, and coil assembly that is the subject of the present invention.

While this invention is susceptible of embodiment in many different forms, there is shown in the drawings and will herein be described in detail, one specific embodiment, with the understanding that the present disclosure is to be considered an exemplification of the principles of the invention and is not intended to limit the invention to the specific embodiment illustrated.

STRUCTURE

Figure 1A:
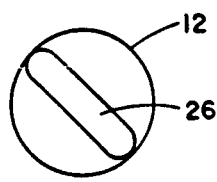
FIG. 1A and 1B are end views of the ring core assembly shown in FIG. 1.
Figure 1C:
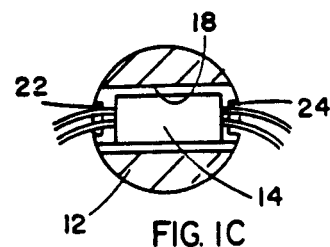
FIG. 1C is a cross-sectional view of the ring core assembly.
Figure 1B:
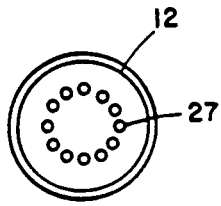

Turning to the drawings, FIG. 1 shows a magnetometer ring core assembly 10. End views are shown in FIGS. 1A and 1B. FIG. 1C is a cross-sectional, side, elevational view, as viewed along line 1C—1C. The ring core assembly 10 comprises a housing 12, two coil assemblies 14 and 16, and associated electrical terminals. Specifically, the ring core assembly 10 is formed from a non-electrically conductive, high temperature thermal plastic, such as PEEK (Poly-ether-ether-ketone), using an injection molding process, which is made by Imperial Chemical Industries (ICI). ICI is in England; its U.S. outlet is called ICI Americas, Inc. of Wilmington, De. Other suitable materials include: Torlon; Polyimide, made by AMOCO Chemical; Aulon, made by Greenstreet and Tweed; Xydar; an Aromatic Polyester Liquid Crystal Polymer, made by Dart Mfg.; and Riton, a polysulfone. The reader is referred to PLASTICS (7th edition, 1985) published by International Selector, Inc. for other sources.

The housing 12 is generally cylindrical and defines two generally rectangular apertures or internal cavities 18 and 20 into which the coil assemblies 14 and 16 are inserted, using a tongue and groove joint. The housing 12 defines a series of axial channels 22 and 24 into which the electrical conductors from each coil assembly 14 and 16 are disposed. One end (see FIG. 1A) of the housing 12 is provided with a generally rectangular alignment key 26. The opposite end (see FIG. 1B) is provided with a plurality of pins 27 to facilitate connecting the electrical leads stemming from each coil assembly 14 and 16.

Figure 2A:
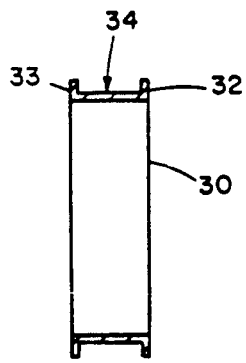
FIG. 2A is a cross-sectional view of the bobbin of FIG. 2.
Figure 2:
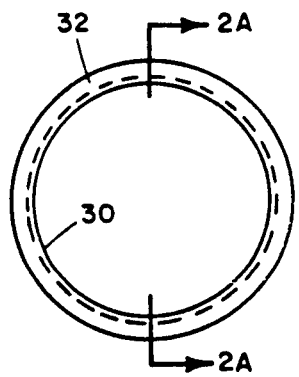
FIG. 2 is a plan view of a bobbin upon which the magnetic core of FIG. 1 is wound.
Figure 3:
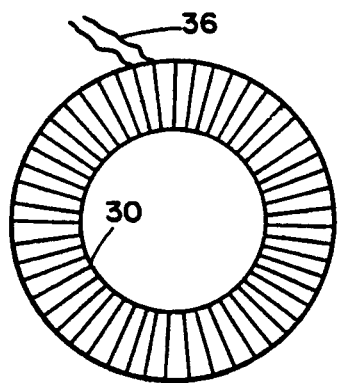
FIGS. 3 and 4 are plan and side elevational views respectively of a toroid wound core assembly.
Figure 4:
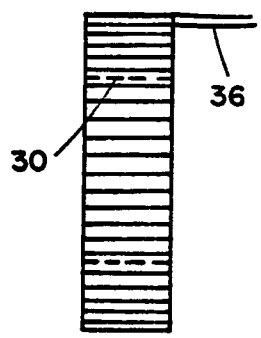

FIG. 2 illustrates the bobbin on which magnetic tape is wound to form the toroid wound coil assembly of FIGS. 3 and 4. The bobbin 30 is generally spool-shaped with flanges 32 and 33 at each end so that the bobbin has a generally U-shaped cross section (see FIG. 2A). In one prototype, the bobbin 30 is approximately ⅛ inch in diameter and has a height of approximately 0.2 inches. As will be described in detail in a later discussion, the bobbin is made from a non-magnetic metal alloy, preferably a copper-nickel alloy. A magnetic core or toroid is formed by winding a thin foil-like strip of magnetic material, such as Permalloy 80, around the bobbin 30. In particular, one end of the strip is welded to the outside surface of the bobbin 30, (at location 34 in FIG. 2A, for example), and then spirally, snugly and uniformly wrapped so as to fill the generally U-shaped channel. The opposite end of the magnetic strip is then welded to itself at a location very close to where the first end was welded to the bobbin 30. In one particular embodiment, the Permalloy strip has a thickness of ⅛ mil and a width of ⅛ inch. After welding, the core structure is annealed at a temperature of approximately 1500 degrees Fahrenheit, in a hydrogen atmosphere, to relieve the residual stresses from welding and from winding. Annealing also serves to improve the "squareness" of the B-H curve of the core. After annealing, a phenolic ring is inserted to cover the bobbin channel and to cover the magnetic strip, and then the assembly is dipped in an epoxy or otherwise potted. Encapsulation allows the core to be wound with an excitation winding directly, without the need for taping. Conventional cores, using stainless steel bobbins, are commercially available from Magnetics, Inc. of Butler, Pa; Infinetics, Inc. of Wilmington, Del.; and Arnold Engineering (subsidiary of Magnetics Electronics, Inc.) of Marengo, Il. Other than the use of the copper-nickel bobbin, the manufacture of the core just described follows well known conventional methods.

Turning now to FIGS. 3 and 4, the toroid wound core assembly is formed by winding, in one particular embodiment, 400 turns of monofilar magnet wire (36 AWG) around the annular core. This electrical winding will form the excitation or drive winding 36 of the magnetometer sensor. The wire should be wound evenly, so that the wrappings are not crossed. The wraps should be layered, and wound as close as possible together, and as tight as possible, without stretching the wire. The last turn should end at the start of the first turn, and the first turn should generally be aligned with the two ends of the magnetic strip which form the core (See FIG. 2A at location 34.) After winding, Kapton tape, for example, may be used to hold the shape of the toroid.

Figure 5:
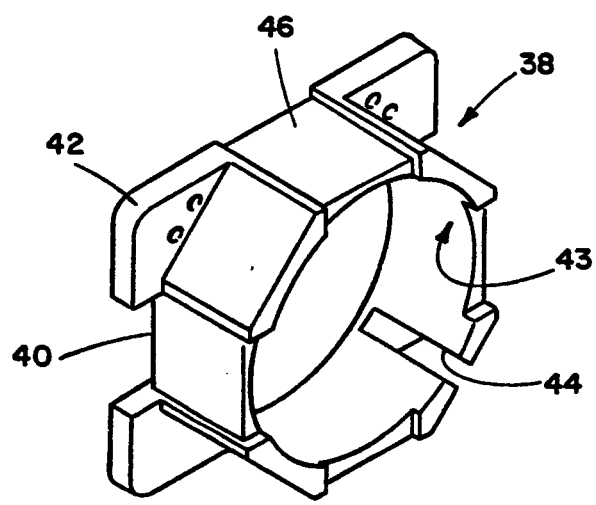
FIG. 5 is a perspective view of the coil form.

Turning now to FIG. 5, a coil form 3B is shown. The coil form is, preferably, made from PEEK, using injection molding techniques, generally as that used to form the housing 12. The coil form 38 has a generally square base 40 defining four legs 42. The interior 43 of the form 38 is generally circular, so as to match the shape and size of the toroid wound coil assembly of FIG. 3. A U-shaped slot 44 is provided for the free ends of the excitation winding 36. The exterior of the coil form 38 defines four generally rectangular channels 46 arranged 90 degrees apart from each other.

Figure 6:
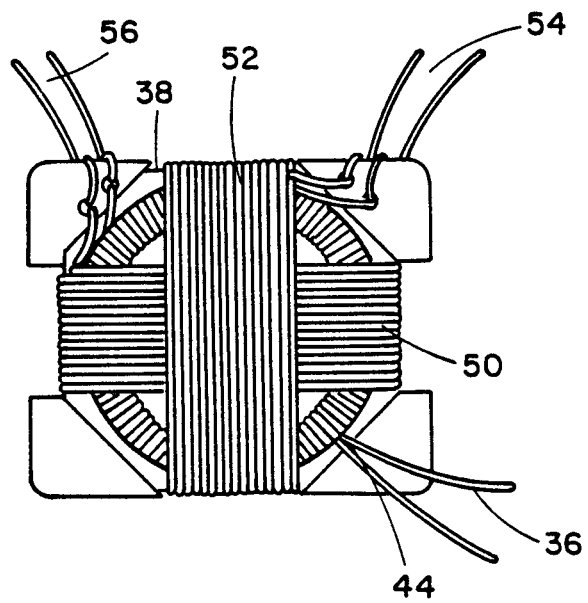
FIG. 6 is a plan view of the coil assembly of FIG. 1.

Turning now to FIG. 6, the toroid wound core assembly of FIG. 3 is inserted into the interior of the coil form 38 with the free ends 36 of the excitation winding passing through the U-shaped slot 44. The toroid assembly is then staked with an adhesive, such as Eccobond 281, on the inside diameter, temporarily clamped and cured. Next, one sense winding 50 is wound around the coil form 38, such that it encircles two opposite portions of the coil and fits within two opposite channels 46 of the coil form. The coil form 38 gives strength and protects the toroid wound core. Magnet wire is used (AWG 40). The wire is wrapped in four even layers and forms what is conventionally referred as the "X-sense" winding. Next, a second sense winding 52 or the "Z-sense" winding is wrapped around the coil form and the first sense winding 50. The second sense winding 52 is at right angles to the first sense winding 50.

Returning to FIG. 1, two coil assemblies of the type shown in FIG. 6 are inserted in the two apertures 18 and 20. In particular, the legs 42 of the form 38 provides a convenient tongue and groove connection. The free ends 54 and 56 of the two sense windings 50 and 52 and the excitation winding 36 are then disposed along the axial channels 22 and 24 (see FIG. 1C), staked and terminated at the pin connectors 27.

BOBBIN MATERIAL

Figure 7:
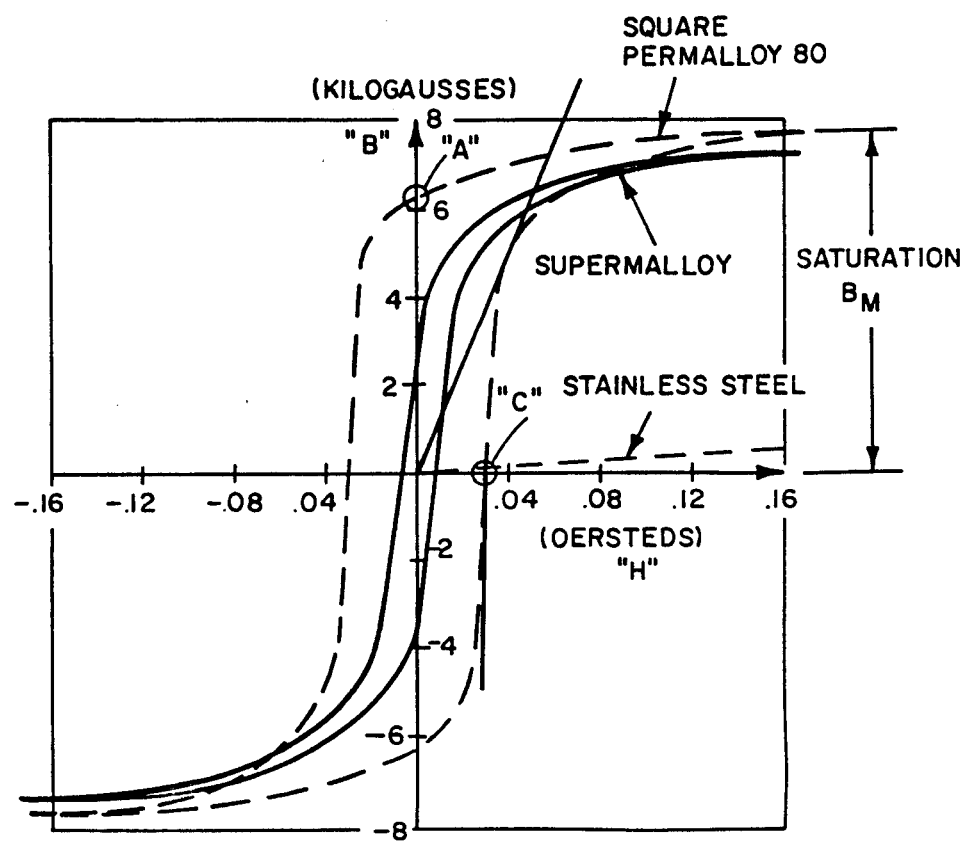
FIG. 7 depicts DC Hysteresis Loops for square Permally-80, Supermalloy, and stainless steel.

Turning now to FIG. 7, this figure shows typical DC Hysteresis Loops for Square Permalloy-80 (a trademark of Magnetics, Inc.), Supermalloy, and stainless steel. There, the Y-axis represents "B", the flux density, and the X-axis represents "H", the magnetic intensity. Thus, if the magnetizing current in the windings of an unmagnetized ring sample is steadily increased from zero to saturation and then reduced to zero, a residual amount of flux density remains. The ordinate OA represents the flux density remaining in the specimen when the magnetic intensity has been reduced to zero, and it is called the retentivity or remanence of the specimen (and is given the designation $B_R$). The abscissa OC represents the reverse magnetic intensity needed to reduce the flux density to zero, after a specimen has been magnetized to saturation in the opposite direction, and it is called the coercive force or coercivity, $H_C$. The maximum slope of the curve represents the magnetic permeability. This curve demonstrates that, after a ring core has been excited by a magnetizing current, a certain amount of residual magnetism is left. As can be seen from the curve, the residual magnetism for a Square Permally-80 sample is greater than that of Supermalloy, and both are significantly greater than that for stainless steel.

Figure 8:
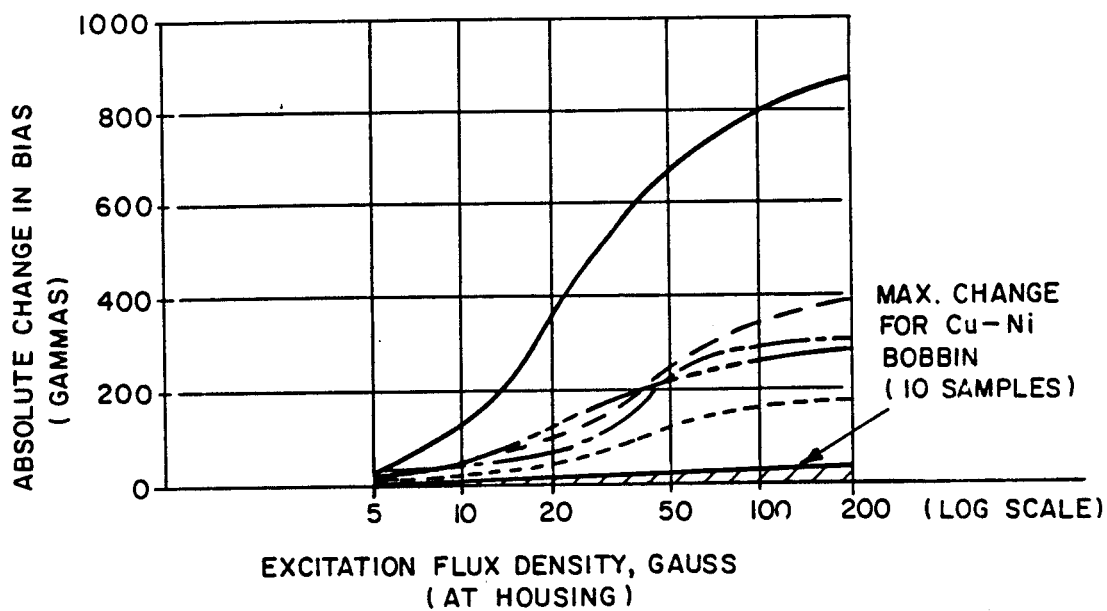
FIG. 8 depicts the bias change due to a residual remanence change for six ring cores using austenitic stainless steel bobbins, and ten ring cores using a copper-nickel bobbin.

FIG. 8 depicts the bias change due to the residual remanence change of six ring cores, having austenitic stainless steel bobbins, and ten ring cores using a copper-nickel bobbin. This curve was obtained by calibrating a magnetometer having a ring core assembly of FIG. 1, and then placing a permanent magnet at various radial distances to change the residual remanence, removing the permanent magnet, and then re-calibrating the magnetometer to observe the change in bias. Clearly, the copper-nickel bobbin has a substantially lower effect on the change in bias than a stainless steel bobbin. This characteristic is most important, inasmuch as those skilled in the art know that when a magnetometer is used in a borehole survey or oil drilling application, the ring core assembly is encased in a drill pipe section and is often stored with other drill pipe sections, or at least kept in their vicinity.

It is common knowledge that one can form a permanent magnet, using the earth's magnetic field (magnet intensity approximately equal to 0.6 gauss), simply by aligning a ferromagnetic material in the direction of the earth's magnetic flux, and then striking it with a hammer or similar device. During the course of drilling, drill pipe sections are raised, lowered, opened, stacked, and otherwise moved about while in the earth's magnetic field; and, thus, ordinary drill pipe sections become magnetized. Therefore, magnetometers, having ring core sensors, can easily fall out of calibration especially if those magnetometers employ ring core assembly having a stainless steel bobbin. Conversely, it should be clear, from FIG. 8, that a magnetometer employing a ring core assembly, using a copper-nickel bobbin, will not be affected as much.

The choice of a copper-nickel bobbin is by no means obvious. For example, nickel often contains iron contamination and, therefore, nickel alloys such as Monel contains residual amounts (perhaps as much as 4 percent) of iron. Titanium does not have these shortcomings, but it cannot be annealed in a hydrogen atmosphere without undergoing embrittlement. Of course, vacuum annealing is possible, but that is relatively more expensive than annealing in a hydrogen atmosphere. As was pointed out previously, annealing is used to remove the strains and impurities of the magnetic tape wound around the bobbin during the winding process. Aluminum is not a good choice for a bobbin material since it is difficult to weld the magnetic tape to the bobbin and will not withstand 1500 degrees F. anneal temperatures.

Although I do not fully understand why copper-nickel performs so well, I have noted that copper and nickel have the same properties that, in hindsight, may help explain the situation. First of all, copper is a diamagnetic material, a material whose permeability is less than that of free. Moreover, copper exhibits the property that it can take 100 percent of nickel, dissolved in it to form a solution. By contrast, a copper-beryllium alloy, especially one selected for non-magnetic tools (Mil-Spec C-21657A (OS)), allows up to 0.40 percent iron or, after special heat treatment, up to 0.10 percent iron. Unfortunately, this alloy softens at approximately 1900 degrees F., might not take the anneal of the core and has an incompatible temperature coefficient with the core material.

I also have found that, because of the way nickel is often contaminated with trace amounts of iron, the copper-nickel alloy used to form the bobbin should, preferably, have the least amount of iron contamination possible. Such copper-nickel alloys are often specified by the U.S. military. In fact, military specifications exist, and material satisfying these military specifications is readily obtainable. Mil-Spec C-15726E (SHIPS) dated Aug. 20, 1965 describes a copper-nickel alloy which I have found to be ideally suited for use in the manufacture of a ring core bobbin. The chemical composition defined by this military standard defines a 70/30 composition as having approximately 65 weight percent copper, 29 percent nickel, 1 percent manganese, and 0.50 percent (nominal) iron. The 90/10 composition has 85 weight percent copper, 9 percent nickel, 0.75 manganese, and 1.50 percent (nominal) iron. Mil-Spec C-20159C covers sand and centrifugal copper-nickel alloy castings. According to that standard, the chemical composition is the same as specified in ASTM B 369, with the exception that the Lead content shall not exceed 0.01 percent, and the sulphur and phosphorous shall not exceed 0.02 percent. A good alternate to Mil-Spec C-15726E is the copper-nickel-manganese alloy defined by Mil-Spec C-22226A (OS). This specification covers an alloy having approximately 60 percent copper, 20 percent nickel, and 20 percent manganese, with iron not exceeding 0.15 weight percent. For purposes of comparison, if one looks to Mil-Spec S-21946A (OS), the specification for annealed austenitic manganese-nickel steel bars, wherein low magnetic permeability is a primary characteristic, one finds that such a material has a magnetic permeability not exceeding 1.10 in a 200-oersted background field, or (optionally) not exceeding 1.01. By comparison, my preferred material has a permeability on the order of 1.0001.

I have found that certain copper-nickel alloys, while characterized as "low permeability alloys", have a permeability which is too high for use in the magnetic sensor in a borehole application. For example Mil-Spec M-17163A (SHIPS) covers a 55–60 percent nickel-copper alloy, where the permeability is specified as being 1.1 in a field of 0.5-oersteds. This is not low enough.

Similarly, a so-called "low magnetic" nickel-titanium alloy, such as that described by Mil-Spec N-81191A (OS), wherein the nickel content varies between 55 and 60 percent, and the titanium content varies between 40.

and 45 percent, would suffer hydrogen embrittlement during annealing at 1500 degrees F.

From the foregoing, it will be appreciated that several variations and modifications may be effected without departing from the true spirit and scope of the novel concept of the invention. It should be understood that no limitation with respect to the specific apparatus illustrated herein is intended or should be inferred. It is of course intended to cover, by dependent claims, all such modifications as fall within the scope of the claims.

I claim:

1. A magnetometer sensor for use in a borehole survey tool, comprising:
   (a) a bobbin made from a non-magnetic copper alloy having a magnetic permeability not greater than 1.001, said alloy comprised of at least 60 percent and at least 9 percent nickel;
   (b) a strip of magnetic metal alloy wrapped around said bobbin to form a magnetic core, said strip having two ends with one end joined to said bobbin;
   (c) at least one excitation winding wrapped around said core; and
   (d) at least one sense winding wrapped around said core and said excitation winding.

2. The magnetometer sensor of claim 1, wherein a frame made from a non-electically conductive, high temperature thermal plastic is disposed between said excitation winding and sense winding.

3. The magnetometer sensor of claim 2, wherein said thermal plastic is selected from the group consisting of polyimide, an aromatic polyester liquid crystal polymer, and polysulfone.

4. The magnetometer sensor of claim 2, wherein said thermal plastic is poly-ether-ether-petone.

5. The magnetometer sensor of claim 1, wherein said alloy is comprised of about 65 weight percent copper, about 29 percent nickel, about 1 percent manganese and less than 0.50 percent iron.

6. The magnetometer sensor of claim 1, wherein said alloy is comprised of about 60 percent copper, about 20 percent nickel, about 20 percent manganese, and less than 0.15 weight percent iron.

7. The magnetometer sensor of claim 1, wherein said magnetic core is annealed before said excitation winding and said sense winding are wrapped around said core.

8. The magnetometer sensor of claim 7, wherein said core is annealed to a temperature of 1500 degrees Fahrenheit in a hydrogen atmosphere.

9. The magnetometer sensor of claim 1, wherein said bobbin is spool-shaped and has a U-shaped cross-section into which said strip is wound.

10. The magnetometer sensor of claim 1, further including a high temperature thermal plastic housing defining an interior cavity into which said magnetic core, excitation winding and sensing winding are carried.

11. The magnetometer sensor of claim 1, wherein said strip is made of Permalloy and is spirally wrapped around said bobbin to form a plurality of layers including an outer layer with the other end of said strip being joined to said outer layer.

12. The magnetometer sensor of claim 1, wherein the thermal coefficient of expansion of said bobbin is generally equal to the thermal coefficient of expansion of said strip.

13. The magnetometer sensor of claim 1, wherein said one end of said strip is welded to said bobbin.

14. The magnetometer sensor of claim 1, wherein said bobbin is generally ring-shaped.

15. The magnetometer sensor of claim 1, wherein said bobbin is an alloy of cooper, nickel and manganese.

16. In a magnetic survey instrument for use in a borehole, a sensor assembly comprising:
   (a) a generally ring-shaped bobbin made from a copper-nickel alloy having a magnetic permeability not greater than 1.0001, said alloy comprised of at least 60 percent copper and at least 9 percent nickel;
   (b) a thin, long strip of Square Permalloy-80 spirally wrapped around said bobbin with one end of said strip welded to said bobbin, to define a toroid having a plurality of overlying layers with the other end of said strip welded to the outermost of said layers and in close proximity to said one end;
   (c) one electrical conductor wrapped around said strip and said bobbin generally at right angles to said strip to define a first winding;
   (d) a plastic frame for carrying therein the structure formed by said toroid and said first winding;
   (e) another electrical conductor wrapped around said frame and two opposite portions of said toroid to define a second winding, the structure formed by said frame, said toroid, and said two windings defining a coil assembly; and
   (f) a high temperature thermal plastic housing having an internal opening, configured to carry said coil assembly, said housing further having at least one axial channel in communication with said opening for carrying the free ends of said windings.

17. The sensor of claim 16, wherein said frame is made from a high temperature thermal plastic.

18. The sensor of claim 16, further including a third winding wrapped around said coil assembly generally at right angles to said second winding.

19. The sensor of claim 16, wherein said frame defines a tongue and said housing defines a complementary groove which is disposed adjacent said opening and which is adapted to receive said tongue.

* * * * *